United States Patent [19]

Kearney et al.

[11] Patent Number: 5,532,627
[45] Date of Patent: Jul. 2, 1996

[54] STACKABLE VOLTAGE COMPARATOR CIRCUIT FOR A MULTIPLE VOLTAGE WINDOW DETECTOR

[75] Inventors: Mark B. Kearney, Kokomo; Dennis M. Koglin, Carmel, both of Ind.

[73] Assignee: Delco Electronics Corporation, Kokomo, Ind.

[21] Appl. No.: 422,433

[22] Filed: Apr. 14, 1995

[51] Int. Cl.⁶ .................................................. H03K 5/153
[52] U.S. Cl. .............................. 327/74; 327/481; 327/578
[58] Field of Search .................................. 327/65, 74, 75, 327/362, 481, 578; 330/252, 254, 257, 260, 261; 326/79

[56]  References Cited

U.S. PATENT DOCUMENTS

| | | | |
|---|---|---|---|
| 4,270,118 | 5/1981 | Brokaw | 327/75 |
| 4,524,330 | 6/1985 | Burgyan | 330/257 |
| 4,542,370 | 9/1985 | Yamada et al. | 327/75 |
| 4,602,168 | 7/1986 | Single | 327/65 |
| 4,717,839 | 1/1988 | Miller | 327/578 |
| 4,857,861 | 8/1989 | Seevinck et al. | 330/260 |

Primary Examiner—Timothy P. Callahan
Assistant Examiner—Terry L. Englund
Attorney, Agent, or Firm—Jimmy L. Funke

[57]  ABSTRACT

A stackable voltage comparator circuit that may be used in an analog voltage address decoder circuit for performing voltage window comparisons. The voltage comparator circuit includes a plurality of voltage comparator circuit cells, each of which includes a differential input stage made up of a pair of transistors which receives a current source. A first comparator circuit cell includes a differential input pair of transistors with one of the transistors having a first collector and a second collector, with the second collector being coupled to an output line. The first comparator circuit cell compares an input window with a first threshold voltage and produces an output at the output line. A second comparator circuit cell compares the input voltage with a second threshold voltage and includes a second differential input pair of transistors. The second comparator circuit cell has an input coupled to the output line of the first comparator circuit for receiving current when the input voltage is less than the first threshold voltage and provides an output indicative of whether the input voltage is within a voltage window bounded by the first and second threshold voltages.

11 Claims, 3 Drawing Sheets

5,532,627

STACKABLE VOLTAGE COMPARATOR CIRCUIT FOR A MULTIPLE VOLTAGE WINDOW DETECTOR

BACKGROUND OF THE INVENTION

1. Technical Field

This invention relates generally to voltage comparator circuity and, more particularly, to a voltage comparator circuit operable for providing successive voltage window detection.

2. Discussion

Voltage comparator circuits are available in many configurations and are employed for a wide variety of uses. Generally speaking, the basic comparator circuit compares an input voltage with a voltage threshold and produces an output voltage or current indicative of the voltage comparison. A voltage window comparison can be accomplished with two voltage comparator circuits to determine if an input voltage has an amplitude within a window defined by two threshold voltages. A typical voltage window comparator circuit includes a first comparator for comparing the input voltage to a first voltage threshold and a second comparator for comparing the input voltage with a second voltage threshold. The output of the first and second comparators are logically ANDed together to determine if the input voltage is within the voltage window bounded by the first and second voltage thresholds.

For some applications, it may be desirable to determine whether an input voltage is within one of several successive voltage windows. In doing so, an array of successive comparators can be connected to a common input voltage, each comparator designed to respond to a distinct reference voltage. To realize successive voltage windows, an array of interconnected comparators, inverters and AND gates could be used. For example, given lower, middle and upper voltage boundaries which define two voltage windows, three comparators could be employed to compare an input voltage with each voltage boundary. That is, a first comparator for comparing the lowest boundary with the input voltage, a second comparator for comparing the middle boundary with the input voltage and a third comparator for comparing the upper boundary with the input voltage. The output of the first comparator could be inverted and logically ANDed with the output of the middle comparator to provide an output which is indicative of the input voltage being within the window bounded by the lowest and middle voltages. Likewise, the output of the second comparator could be inverted and logically ANDed with the output of the third comparator to provide an output which is indicative of the input voltage being within the window bounded by the middle and upper voltages.

According to this configuration, N continuous voltage window comparisons could be accomplished, where 2N +1 comparators would generally be required. While the above-mentioned voltage window comparator circuit could be employed to provide successive voltage window detection, a relatively large number of comparators are required. Accordingly, the large number of comparators adds to the overall size and cost of the circuitry.

It is therefore desirable to provide for a voltage window comparator circuit and method for comparing an input voltage with voltage windows in a manner which requires a minimum number of components.

More particularly, it is desirable to provide for a voltage window comparator circuit and method for comparing a voltage input with successive voltage windows and with relatively few comparators to provide a simplified digital output.

It is further desirable to provide for such a voltage window comparator circuit and method for providing a digital output based on a comparison of successive voltage windows to accomplish voltage decoding for memory addressing.

SUMMARY OF THE INVENTION

In accordance with the teachings of the present invention, a successive voltage window comparator circuit and method are provided for achieving multiple voltage window detection. The comparator circuit includes a plurality of interconnected comparator circuits. Each circuit has a differential input stage made up first and second connected transistors, and each differential input stage receives a current source. The first transistor receives a reference voltage, while the second transistor receives an analog input voltage. A current mirror provides a differential to single ended converter for the differential input stage. The second transistor has a first collector and a second collector, with the second collector being coupled to the next highest voltage window comparator circuit. The next highest voltage window comparator circuit has an input which receives current from the second collector of the second transistor of the first comparator circuit when the input voltage is less than the first reference voltage. Each comparator circuit outputs a binary output indicative of the voltage window comparison performed therewith.

This application is one of two applications filed on the same day, both commonly assigned and having similar specifications and drawings, the other application being identified below:

| U.S. Ser. No. | Title |
| --- | --- |
| 08/423,008, Filed April 14, 1995 | ANALOG VOLTAGE ADDRESS DECODER CIRCUIT |

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
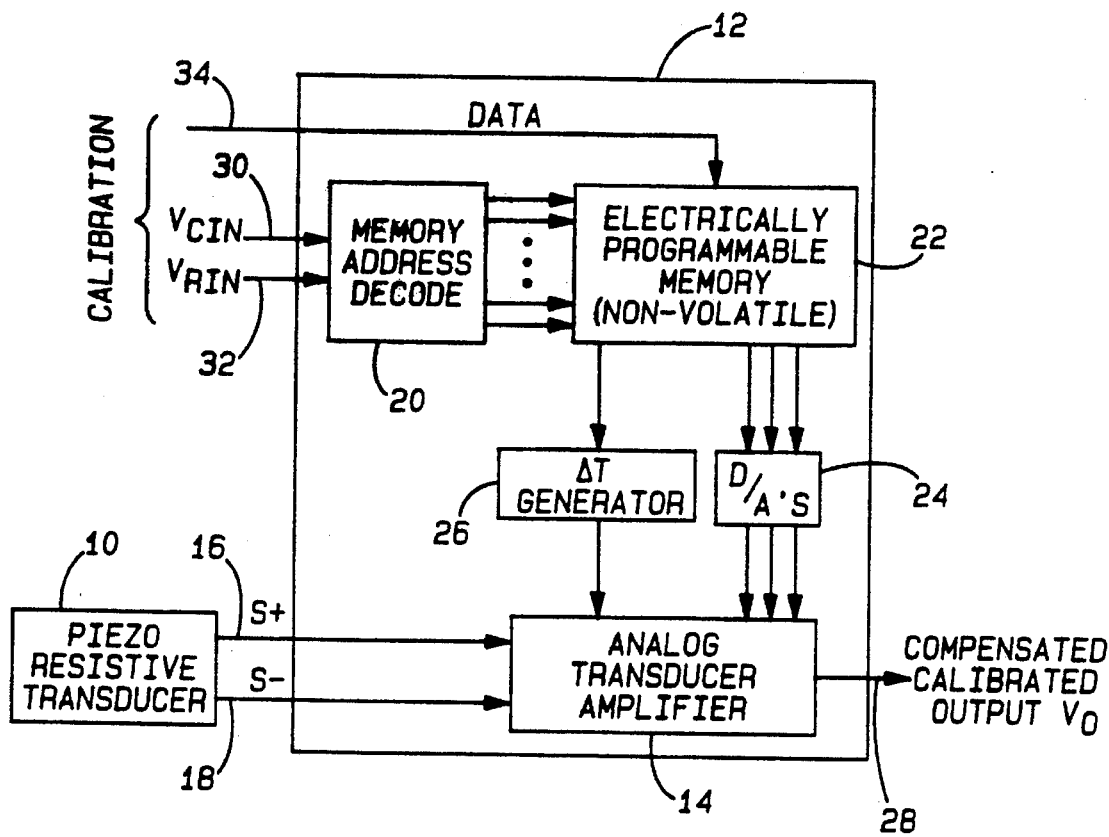
FIG. 1 is a block diagram of a piezoresistive transducer and amplifier conditioning circuitry containing an analog voltage address decoder circuit.

Turning now to FIG. 1, a piezoresistive transducer 10 is shown connected to an amplifier signal conditioning chip 12. According to the example shown, the piezoresistive transducer 10 may include a pressure transducer or a motion/accelerometer transducer or other similar sensing device. Piezoresistive transducers are generally configured as strain sensing transducers which are commonly formed on a die. Since piezoresistive transducers are generally known to produce very small outputs, the outputs must therefore be sufficiently amplified. The amplifier signal conditioning chip 12 contains an analog transducer amplifier 14 for receiving differential outputs S+ and S− from transducer output lines 16 and 18, respectively. The analog transducer amplifier 14 adequately amplifies the transducer outputs and provides a compensated calibrated single-ended output voltage $V_0$ on output line 28.

Generally speaking, the amplifier signal conditioning chip 12 includes a memory address decode circuit 20 with comparator circuitry in accordance with the present invention. The memory address decode circuit 20 receives memory address analog input voltages $V_{CIN}$ and $V_{RIN}$ on input lines 30 and 32, respectively. The memory address decode circuit 20 decodes the analog input voltages $V_{CIN}$ and $V_{RIN}$ and addresses the memory location that is to be accessed from an electronically programmable memory array 22. According to the application shown, the electronically programmable memory 22 is selectively accessed and programmed so as to adjust for initial parameters, such as gain and offset, of the transducer amplifier 14. Also included on the amplifier signal conditioning chip 12 is a temperature change generator 26 and digital-to-analog converter circuitry 24.

Address Decoder Circuit

Figure 2:
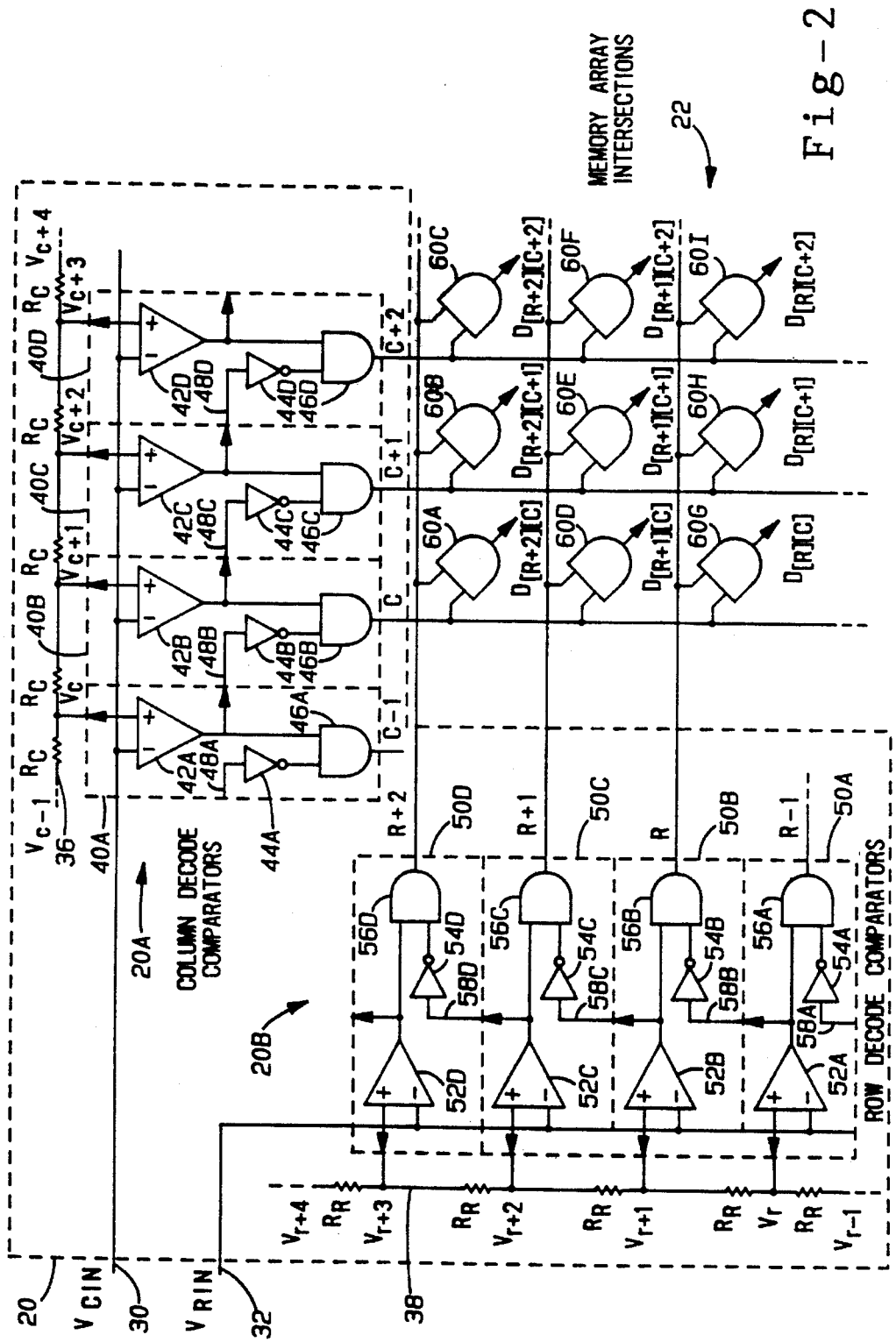
FIG. 2 is a circuit diagram illustrating the analog voltage address decoder circuit with decode comparator circuitry for addressing memory locations of a memory array.

With particular reference to FIG. 2, the memory address decode circuitry 20 is shown configured with a portion of the electronically programmable memory array 22. The address decode circuitry 20 generally includes a column decode comparator network 20A and a row decode comparator network 20B. The column decode comparator network 20A compares the analog input voltage $V_{CIN}$ on line 30 with a plurality of successive voltage windows to determine which column of the memory array 22 is to be addressed. Likewise, the row decode comparator network 20B compares the analog input voltage $V_{RIN}$ on line 32 with a plurality of successive voltage windows to determine which row in the memory array 22 is to be addressed.

More particularly, the column decode comparator network 20A is made up of an array of interconnected voltage window comparator circuits 40A through 40D. Each voltage window comparator circuit such as circuit 40A includes a comparator 42A, an inverter 44A and a logic AND gate 46A. Each of the comparators 42A through 42D is configured to receive and compare the input voltage $V_{CIN}$ with a reference voltage. For example, the first comparator 42A has an inverting input (−) for receiving the input voltage $V_{CIN}$ and a non-inverting input (+) for receiving a reference voltage $V_C$. The logic AND gate 46A has a first input coupled to an output of the comparator 42A and a second input shown coupled to the output of inverter 44A. For the lowest voltage window comparator circuit 40A, the inverter 44A has an input line that is generally left in a condition so that the inverter 44A output is in a "high" logic state. However, the higher voltage window comparator circuits 40B through 40D have inverters 44B through 44D coupled, via respective lines 48B through 48D, to comparator outputs from the next lowest circuit as will be described herein.

Referring to the next highest voltage window comparator circuit 40B, the second comparator 42B has an inverting input (−) coupled to the input voltage $V_{CIN}$ and a non-inverting input (+) coupled to a reference voltage $V_{C+1}$. A logic AND gate 46B has a first input coupled to the output of the second comparator 42B and a second input coupled to an output of inverter 44B. Inverter 44B, in turn, has an input connected to the output of first comparator 42A via line 48B. The third voltage window comparator circuit 40C likewise includes third comparator 42C having an inverting input and a non-inverting input for receiving the input voltage $V_{CIN}$ and a reference voltage $V_{C+2}$, respectively. Also included is a logic AND gate 46C with a first input coupled to the output of the third comparator 42C and a second input coupled to an inverter 44C which in turn is coupled to the output of second comparator 42B via line 48C. Finally, the last (i.e. highest) voltage window comparator circuit 40D shown likewise includes a fourth comparator 42D with a first input for receiving the input voltage $V_{CIN}$ and a second input for receiving a reference voltage $V_{C+3}$. A logic AND gate 46D has a first input coupled to an output of fourth comparator 42D and a second input coupled to an output of an inverter 44D which in turn is connected to the output of the third comparator 42C via line 48D.

The reference voltage thresholds $V_C$, $V_{C+1}$, $V_{C+2}$ and $V_{C+3}$ are preferably tapped from a resistor divider string 36 which includes a plurality of series connected resistors $R_C$ connected to a voltage potential. Also shown is a lowest voltage reference $V_{C-1}$ and a highest voltage reference $V_{C+4}$. The reference voltages $V_{C-1}$ through $V_{C+4}$ may be used as voltage boundaries which define an array of successive voltage windows. According to a preferred embodiment, resistors $R_C$ are equal valued to provide for successive voltage windows which have substantially equal window sizes.

Each voltage window comparator circuit has an output line extending from an output of the corresponding logic AND gate 46 to the memory array 22. More particularly, voltage window comparator circuits 40A through 40D include respective output lines C−1, C, C+1 and C+2. When the analog input voltage $V_{CIN}$ is within a voltage window detected by one of the comparator circuits, the corresponding output line will output a "high" binary output. For example, when input voltage $V_{CIN}$ is bounded within reference voltages $V_C$ and $V_{C+1}$, voltage window comparator circuit 40B will output a "high" binary output on output line C. At the same time, each of the remaining output lines C−1, C+1 and C+2 will output a "low" binary output.

The row decode comparator network 20B is likewise configured with a plurality of voltage window comparator circuits 50A through 50D for comparing the analog input voltage $V_{RIN}$ with a series of successive voltage windows. The lowest voltage window comparator circuit 50A includes a voltage comparator 52A having an inverting input (−) for receiving the input voltage $V_{RIN}$ and a non-inverting input (+) for receiving a voltage reference $V_R$. A logic AND gate 56A has a first input coupled to the output of the first comparator 52A and a second input coupled to the output of an inverter 54A. For the lowest voltage window circuit 50A, the inverter 54A has an input 58A that is generally left in a condition so that the inverter 54A is in a "high" logic state. However, each of the higher voltage window comparator circuits 50B through 50D have an inverter with an input coupled to a comparator output from the next lowest comparator circuit as discussed hereinafter.

The next highest voltage window comparator circuit 50B has a second comparator 52B for comparing the input voltage $V_{RIN}$ with a second voltage potential $V_{R+1}$. A logic AND gate 56B has a first input coupled to an output of the second comparator 52B and a second input coupled to an output of inverter 54B. Inverter 54B, in turn, has an input coupled to the output of the first comparator 52A via line 58B. Similarly, voltage window comparator circuit 50C has a third comparator 52C for comparing the input voltage $V_{RIN}$ with a voltage reference $V_{R+2}$. A logic AND gate 56C has a first input coupled to an output from the third comparator 52C and a second input coupled to an inverter 54C. Inverter 54C has an input coupled to an output of the second comparator 52B via line 58C. Finally, the highest shown voltage window comparator circuit 50D has a fourth comparator 52D for comparing the input voltage $V_{RIN}$ with a voltage potential $V_{R+3}$. A logic AND gate 56D has a first input coupled to an output of fourth comparator 52D and a second input coupled an output of an inverter 54D. Inverter 54D has an input coupled to the output of the third comparator 52C via line 58D.

The reference voltage thresholds $V_R$, $V_{R+1}$, $V_{R+2}$ and $V_{R+3}$ are also preferably tapped from a second resistor divider network 38. Divider network 38 includes a plurality of series connected resistors $R_R$ connected to a voltage potential. Also shown supplied from the second resistor divider network 38 is a lowest reference voltage $V_{R-1}$ and a highest reference voltage $V_{R+4}$. The reference voltages $V_{R-1}$ through $V_{R+4}$ provide voltage boundaries that may be used to define an array of successive voltage windows. According to a preferred embodiment, resistors $R_R$ are equal valued to provide a series of successive equal sized voltage windows.

The array of interconnected voltage window comparator circuits 50A through 50D likewise include output lines R−1, R, R+1 and R+2, respectively. The output lines R−1, R, R+1 and R+2 extend from outputs of the logic AND gates 56A through 56D to the memory array 22. When the input voltage $V_{RIN}$ is within a voltage window detected by one of the comparator circuits, the corresponding output line will output a "high" binary output. For instance, when input voltage $V_{RIN}$ is detected within a voltage window bounded by reference voltages $V_R$ and $V_{R+1}$, voltage window comparator circuit 50B will output a "high" binary output on output line R. At the same time, the remaining output lines R−1, R+1 and R+2 will each output a "low" binary output.

The column decode comparator output lines C−1, C, C+1 and C+2 are connected in a first dimension of columns to the memory array 22. Similarly, the row decode comparator circuit output lines R−1, R, R+1 and R+2 are connected in a second dimension of rows to the memory array 22. Within the memory array 22, each memory location is accessed via a two-input logic AND gate 60 which has first and second inputs connected to the corresponding row and column lines. Accordingly, in order to access a particular memory location, such as memory location D[R+2][C], logic AND gate 60A requires simultaneous "high" binary outputs on column output line C and row output line R+2.

In operation, the analog voltage address decoder circuit 20 receives the column addressing voltage input $V_{CIN}$ on line 30 and the row addressing input voltage $V_{RIN}$ on line 32. The analog input voltages $V_{CIN}$ and $V_{RIN}$ have voltage amplitudes which are indicative of a particular memory location to be addressed. The input voltage $V_{CIN}$ is compared with a successive series of reference voltages such as $V_C$, $V_{C+1}$, $V_{C+2}$ and $V_{C+3}$. More particularly, a plurality of successive voltage windows are defined by the column decode comparator network 20A. The lowest voltage window comparator circuit 40A compares the input voltage $V_{CIN}$ with reference voltage $V_C$. The next voltage window comparator circuit 40B compares the input voltage $V_{CIN}$ with a voltage window bounded by reference voltages $V_C$ and $V_{C+1}$. Similarly, the third comparator circuit 40C compares the input voltage $V_{CIN}$ with the next highest successive voltage window bounded by reference voltages $V_{C+1}$ and $V_{C+2}$. The fourth voltage window comparator circuit 40D compares voltage $V_{CIN}$ with the highest voltage window bounded by reference voltages $V_{C+2}$ and $V_{C+3}$.

The row decode comparator network 20B likewise receives row addressing input voltage $V_{RIN}$ on line 32 which has a voltage amplitude that is indicative of a particular row to be accessed from memory array 22. In doing so, the first voltage window comparator circuit 50A compares the input voltage $V_{RIN}$ with reference voltage $V_R$. The next voltage window comparator circuit 50B compares input voltage $V_{RIN}$ with a voltage window bounded by reference voltages $V_R$ and $V_{R+1}$. Comparator circuit 50C likewise performs a comparison with the next highest successive voltage window bounded by reference voltages $V_{R+1}$ and $V_{R+2}$. The fourth voltage window comparator circuit 50D provides a comparison of input voltage $V_{RIN}$ with the highest voltage window bounded by reference voltages $V_{R+2}$ and $V_{R+3}$.

The row decode comparator network 20B decodes the input voltage $V_{RIN}$ and determines which row is to be accessed as a function of the amplitude of analog input voltage $V_{RIN}$. Similarly, the column decode comparator network 20A decodes the input voltage $V_{CIN}$ and determines which column is to be accessed as a function of the amplitude of analog input voltage $V_{CIN}$. For example, if the input analog voltage $V_{RIN}$ is within the voltage window defined by reference voltages $V_{R+2}$ and $V_{R+3}$, the row output line R+2 from comparator circuit 50D will produce a "high" binary output, while the remaining row output lines R+1, R and R−1 each produces a "low" binary output. Likewise, whenever the input analog voltage $V_{CIN}$ is detected within a voltage window such as that defined by reference voltages $V_{C+1}$ and $V_{C+2}$, the column output line C+1 corresponding to the voltage window comparator circuit 40C produces a "high" binary output, while the remaining output lines C−1, C and C+2 each produces a "low" binary output.

The voltage windows are each defined by a high end voltage and a low end voltage. For example, voltage window comparator circuit 40B employs reference voltage $V_{C+1}$ as a high end voltage for comparison with the input signal. The low end voltage for circuit 40B is defined by the reference voltage $V_C$ which is compared with the next lowest comparator circuit 40A. Whenever the input voltage $V_{CIN}$ exceeds reference voltage $V_C$, line 48B outputs a "low" binary output to inverter 44B which inverts the output to a "high" binary signal that is input to logic AND gate 46B. Accordingly, comparator circuit 40B is able to identify that the voltage $V_{CIN}$ exceeds the voltage window of the next lowest comparator circuit 40A.

The memory location intersecting the corresponding row and column containing the "high" binary outputs will therefore be accessed via the corresponding logic AND gate 60. For example, memory location D[R][C] will be accessed when column output line C and row output line R are both simultaneously "high". This will occur when the column input voltage $V_{CIN}$ is bounded by the voltage window defined by reference voltages $V_C$ and $V_{C+1}$ and the row input voltage $V_{RIN}$ is bounded by the window defined by reference voltages $V_R$ and $V_{R+1}$. Once a particular memory location is addressed, the accessed memory location may be used to read or write to the memory location as should be apparent to one in the art.

While the address decoder circuit 20 is shown and described herein in connection with a preferred embodiment for address decoding a row and column memory array 22, the teachings are applicable to addressing any single or multiple dimension electronic array. For example, a single decode network such as column decode comparator network 20A could be used to address particular locations in a single-dimension electronic array. Additionally, three decode comparator networks could be employed to address a particular location in a three-dimensional electronic array. This is generally accomplished with only one analog input voltage required to address each dimension of the array. It should also be evident that any number of comparator circuits could be used to compare an analog input voltage with N voltage windows. However, the address decoder circuit is most applicable to realizing a reasonable number of voltage windows for detecting a reasonable number of locations in the electronic array.

Stackable Voltage Comparator Circuit

Figure 3:
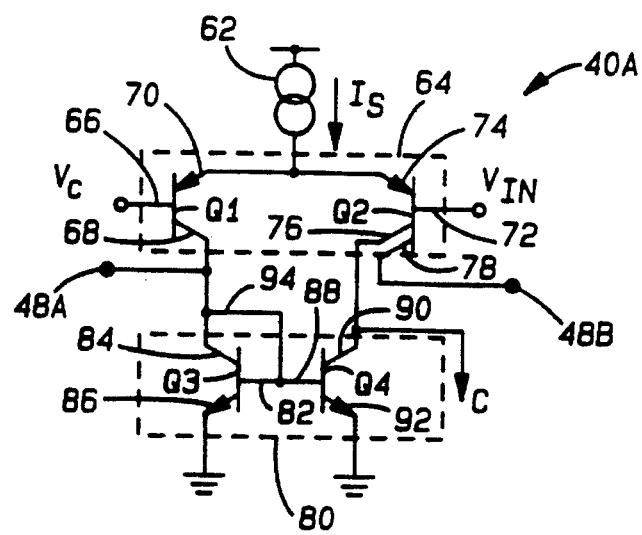
FIG. 3 is a circuit diagram illustrating one voltage window comparator circuit cell used in the decode comparator circuitry of FIG. 2.

Turning now to FIG. 3, a single voltage window comparator circuit cell 40A which may be used as one of the voltage window comparator circuits 40A through 40D and 50A through 50D is illustrated therein. The individual voltage window comparator circuit cell 40A includes a differential input stage 64 made up of a pair of emitter-coupled transistors Q1 and Q2. The first and second transistors Q1 and Q2 are preferably PNP configured bipolar transistors. Transistor Q1 has a base 66, a collector 68 and an emitter 70. The second transistor Q2 is equipped with a base 72, an emitter 74 and first and second collectors 76 and 78.

The differential input stage 64 receives a sourced current $I_s$ from a current supply 62. The sourced current $I_s$ is supplied to the emitters 70 and 74 of respective transistors Q1 and Q2 so as to add in the differential input stage 64 to bias the transistors Q1 and Q2. The base 66 of transistor Q1 is coupled to an input for receiving a reference voltage such as reference voltage $V_C$. The base 72 of transistor Q2 is coupled to an input for receiving an analog input voltage $V_{IN}$ such as voltage $V_{CIN}$. In effect, differential action between transistors Q1 and Q2 provides for a comparator function.

The comparator circuit cell 40A also includes a current mirror 80 coupled between the collector 68 of transistor Q1 and the first collector 76 of transistor Q2. The current mirror 80 is preferably made up of a pair of base-coupled NPN bipolar transistors Q3 and Q4. Transistor Q3 has a base 82, a collector 84 and an emitter 86. Similarly, transistor Q4 has a base 88, a collector 90 and an emitter 92. The base 82 of transistor Q3 and base 88 of transistor Q4 are tied together to form the base-coupled transistor pair. The collector 84 of transistor Q3 is coupled to the collector 68 of transistor Q1. The collector 90 of transistor Q4 is similarly coupled to the first collector 76 of transistor Q2. The emitters 86 and 92 of respective transistors Q3 and Q4 are each coupled to ground. Additionally, the collector 84 of transistor Q3 is connected to the bases 82 and 88 of respective transistors Q3 and Q4 via line 94.

The input line 48A is also coupled to the current mirror 80. The current mirror 80 serves as a differential-to-single ended converter for the differential input stage 64. In addition, the current mirror 80 also serves as a logic inverter for inputs received via input 48A. An output line C is coupled to the first collector 76 of transistor Q2 and the collector 90 of transistor Q4. As previously mentioned, the output line C supplies a binary "high" or "low" output as a function of the comparison performed by the voltage window comparator circuit cell 40A. In addition, output line 48B is coupled to the second collector 78 of transistor Q2 for sourcing current when input voltage $V_{IN}$ is less than reference voltage $V_C$.

Figure 4:
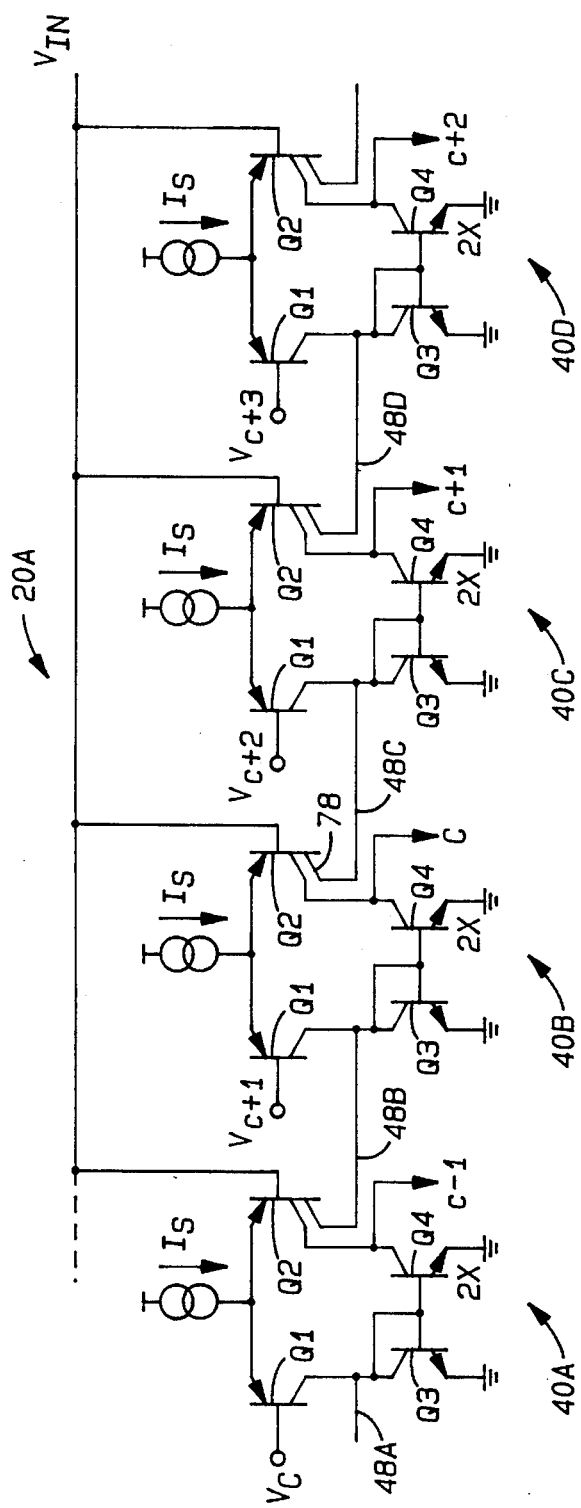
FIG. 4 is a circuit diagram illustrating replicated comparator circuit cells interconnected to provide successive voltage window detection.

Referring now to FIG. 4, the column decode comparator network 20A is illustrated using a plurality of interconnected voltage window comparator circuit cells 40A through 40D as shown in FIG. 3. The four voltage window comparator circuit cells 40A through 40D are interconnected to provide voltage comparison with a plurality of successive voltage windows. More particularly, the first comparator circuit cell 40A receives the analog input voltage $V_{IN}$ at the base 72 of transistor Q2 and receives the reference voltage $V_C$ at the base 66 of transistor Q1. Since circuit comparator cell 40A is shown as the lowest voltage window comparator, the input on line 48A is preferably left disconnected so as to provide a voltage window defined by voltages less than reference voltage $V_C$.

The second comparator circuit cell 40B likewise receives input voltage $V_{IN}$ at the base 72 of transistor Q2 and the next highest successive reference voltage $V_{C+1}$ at the base 66 of transistor Q1. In addition, the second comparator circuit cell 40B receives an input on line 48B which is connected to the second collector 78 of transistor Q2 of the first comparator circuit cell 40A. The second collector 78 of transistor Q2 in comparator circuit cell 40A will source current thereon whenever the input voltage $V_{IN}$ is less than the reference voltage $V_C$. Current sourcing on line 48B therefore indicates that the analog input voltage $V_{IN}$ is less than the voltage threshold detected by comparator circuit cell 40A.

The third comparator circuit cell 40C likewise receives input voltage $V_{IN}$ at the base 72 of transistor Q2 and the next highest successive reference voltage $V_{C+2}$ at the base 66 of transistor Q1. The comparator circuit cell 40C is interconnected with comparator circuit cell 40B via line 48C. The second collector 78 of transistor Q2 of comparator cell 40B sources current on line 48C whenever the voltage input $V_{IN}$ is less than the reference voltage $V_{C+1}$. Accordingly, the voltage comparison proceeds to the next highest successive voltage window provided by comparator circuit cell 40C.

Finally, the fourth or highest comparator circuit cell 40D shown similarly receives input voltage $V_{IN}$ at the base 72 of transistor Q2 and a reference voltage $V_{C+3}$ at the base 66 of transistor Q1. Comparator circuit cell 40D is coupled to the second collector 78 of transistor Q2 of comparator circuit cell 40C via line 48D. Current sourced on line 48D is indicative that the input voltage $V_{IN}$ is less than the voltage reference $V_{C+2}$. It should be understood that the decode comparator network 20A could include any number of comparator circuit cells interconnected as described herein.

The stacked voltage comparator network 20A provides successive voltage window detection with a relatively small number of components. In addition, the comparator circuit cells, as shown in FIGS. 3 and 4, provide a dead band near each voltage threshold to eliminate the possibility of two successive windows simultaneously being detected. Furthermore, transistor Q4 of each comparator circuit cell 40 is designed to have twice the emitter area of that provided in transistor Q3 and will normally conduct twice the amount of current that is conducted by transistor Q3.

In operation, the stacked voltage window comparator circuit 20A compares the analog input voltage $V_{IN}$ with multiple voltage windows to detect the voltage window bounding the input voltage $V_{IN}$. In doing so, the input voltage $V_{IN}$ is compared with the successive voltage windows defined by the predetermined reference voltages. For example, the first comparator circuit cell 40A may define a voltage window of less than the reference voltage $V_C$. The second comparator circuit cell 40B defines a voltage window bounded by reference voltages $V_C$ and $V_{C+1}$, while the third comparator cell 40C defines a voltage window bounded by reference voltages $V_{C+1}$ and $V_{C+2}$. The fourth and last shown comparator circuit cell 40D similarly defines a Voltage window bounded by reference voltages $V_{C+2}$ and $V_{C+3}$.

When input voltage $V_{IN}$ is sufficiently less than the voltage reference $V_C$, transistor Q2 of comparator circuit cell 40A conducts nearly all of the source current $I_S$ supplied to comparator circuit cell 40A. The source current $I_S$ splits nearly equally between the two collectors 76 and 78 of transistor Q2. At the same time, transistor Q2 of the second comparator circuit cell 40B conducts nearly all of source current $I_S$ of the comparator circuit cell 40B. Since the input voltage $V_{IN}$ is less than the reference voltage $V_C$ and no current flows into line 48A of comparator cell 40A, the output on output line C–1 provides a "high" binary output.

When the input voltage $V_{IN}$ is sufficiently less than reference voltage $V_C$, one-half of the source current $I_S$ of comparator circuit cell 40A is passed by the collector 78 of transistor Q2 through line 48B to comparator circuit cell 40B. This current is mirrored by transistors Q3 and Q4 of comparator circuit cell 40B with a gain of two (2) due to the area ratio of transistors Q4 to Q3. The collector 90 of transistor Q4 of comparator circuit cell 40B will then attempt to sink a current equal to source current $I_S$ of comparator circuit cell 40A. However, the collector 76 of transistor Q2 of comparator circuit cell 40B is only capable of sourcing a current of one-half the source current $I_S$. Therefore, the output on output line C of comparator circuit cell 40B is held at a logic "low" whenever the input voltage $V_{IN}$ is less than reference voltage $V_C$.

When the input voltage $V_{IN}$ is sufficiently greater than reference voltage $V_C$, transistor Q1 of comparator circuit cell 40A conducts nearly all of source current $I_S$ of comparator circuit cell 40A. Since little current is conducted by transistor Q2 of comparator circuit cell 40A, the output on output line C–1 provides a logic "low" output.

When input voltage $V_{IN}$ is sufficiently greater than reference voltage $V_C$ but sufficiently less than reference voltage $V_{C+1}$, the second comparator circuit cell 40B produces a "high" binary output on output line C. In this voltage window region, transistor Q1 of comparator circuit cell 40A conducts nearly all of source current $I_S$ of comparator circuit cell 40A, but transistor Q2 of comparator circuit cell 40B conducts nearly all of source current $I_S$ of comparator circuit cell 40B. Since little current, if any, is sourced onto line 48B, transistor Q1 of comparator circuit cell 40B conducts little current, and very little current is mirrored by transistor Q4 of comparator circuit cell 40B. The collector 76 of transistor Q2 of comparator cell 40B then forces the output on line C to a "high" binary output and the condition $V_C \leq V_{IN} \leq V_{C+1}$ is detected.

When the input voltage $V_{IN}$ is near reference voltage $V_C$, it may be assumed that the input voltage $V_{IN}$ is sufficiently lower than reference voltage $V_{C+1}$ so that transistor Q2 of comparator circuit cell 40B conducts nearly all of source current $I_S$. The first and second collectors 76 and 78 of transistor Q2 of comparator circuit cell 40B are preferably equal and each will conduct approximately one-half of the sourced current $I_S$. The output on output line C of comparator circuit cell 40B will be "high" unless sufficient current is supplied on line 48B from comparator circuit cell 40A. A transition of the output on output line C from a "high" to a "low" binary output will occur when the collector current of transistor Q4 of comparator circuit cell 40B exceeds one-half of the sourced current $I_S$. Since transistor Q4 has twice the ratio of transistor Q3, this will occur when the current into line 48B begins to exceed one-fourth of current $I_S$. Also, since the current on line 48B comes from the second collector 78 of comparator circuit cell 40A, the relationship of input voltage $V_{IN}$ to referenced voltage $V_C$ may be determined by examining the operation of the comparator circuit cell 40A. Assuming the source current $I_S$ of comparator circuit cells 40A and 40B are substantially equal and line 48B supplies one-fourth of current $I_S$ to comparator circuit cell 40B, each of the first and second collectors 76 and 78, respectively, of comparator circuit cell 40A is assumed to conduct one-fourth of current $I_S$. Since the total current conducted by transistor Q2 of comparator circuit cell 40A is one-half the current $I_S$, the remaining one-half of current $I_S$ is conducted by transistor Q1 of comparator circuit cell 40A. Transistors Q1 and Q2 are assumed to be sufficiently equal so that the respective base-to-emitter voltages of each match under equal currents.

As the input voltage $V_{IN}$ approaches reference voltage $V_{C+1}$, it may be assumed that very little current flows through transistor Q2 of comparator circuit cell 40A and the current on line 48B approaches zero. The output C of the second comparator circuit cell 40B will remain high until the collector current of transistor Q4 of comparator circuit cell 40B exceeds the current on the first collector 76 of transistor Q2 of comparator circuit cell 40B. This will occur when the voltage is at the upper threshold for the window detected by the output on output line C and generally occurs when one-fifth of current $I_S$ is conducted by transistor Q1 of the comparator circuit cell 40B. A current of four-fifths of current $I_S$ is conducted by transistor Q2 under this condition and splits substantially equally between the two collectors 76 and 78. Because the relationship of Q3 to Q4 is twice the area, two-fifths of current $I_S$ is conducted by the collector 90 of transistor Q4 which matches the current conducted by the first collector 76 of transistor Q2. Since the transition occurs when transistor Q1 conducts one-fifth of current $I_S$ and transistor Q2 conducts a total of four-fifths of current $I_S$, an offset voltage is present between the input voltage $V_{IN}$ and reference voltage $V_{C+1}$. The total current through transistor Q2 is approximately four times the current to transistor Q1 of comparator circuit cell 40B so the offset voltage may be approximately 36 mV at 25 degrees Celcius.

The voltage window bounded by reference voltages $V_{C+1}$ and $V_{C+2}$ is detected in a similar fashion by comparator circuit cell 40C. The lower threshold is set at the input voltage $V_{IN}$ substantially equal to reference voltage $V_{C+1}$ and the upper threshold is set at approximately $V_{C+2}-36$ mV. Accordingly, a dead band exists for $V_{C+2}-36$ mV $\leq V_{IN} \leq V_{C+2}$, when neither comparator circuit cell outputs on output lines C or C+1 is "high". This may advantageously guarantee that successive outputs cannot be high simultaneously. While the dead band in this example is approximately 36 mV at 25 degrees Celcius, it can be set to other values by the appropriate scaling of the area ratio of transistors Q3 and Q4 and the ratio of the two collectors 76 and 78 of transistor Q2 in each of the comparator circuit cells 40A through 40D.

Figure 5:
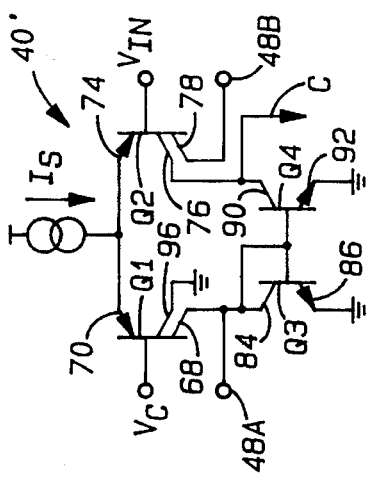
FIG. 5 is a circuit diagram illustrating an alternate embodiment of the voltage window comparator circuit cell of FIG. 3.

The individual comparator circuit cells 40A through 40D may be modified to eliminate the dead band between successive windows according to an alternate embodiment as shown by the comparator circuit cell 40' as provided in FIG. 5. As shown in FIG. 5, transistor Q1 is modified to include a second collector 96. Accordingly, the current conducted by transistor Q1 is split between collectors 68 and 96 to thereby shunt a portion of the current to ground as determined by the ratio of the two collectors 68 and 96.

When input voltage $V_{IN}$ is equal to the reference voltage $V_C$ shown, it is desired that the source current $I_S$ split equally between transistors Q1 and Q2 so that the respective base to emitter voltages of each are equal. If the two collectors 76 and 78 of transistor Q2 are assumed to be equal and the area ratio of transistor Q4 to transistor Q3 is assumed to be twice, a ratio for the two collectors 68 and 96 of transistor Q1 can be calculated that will cause a transition to occur when the currents conducted by transistors Q1 and Q2 are equal and the input voltage $V_{IN}$ is very nearly equal to the reference voltage $V_C$. If current $I_S$ splits evenly between transistors Q1 and Q2, then one-half of current $I_S$ is generally conducted by each. Since the two collectors 76 and 78 of transistor Q2 are equal, the output transition will begin to occur when the collector 90 of transistor Q4 conducts the same current conducted by collector 76 of transistor Q2 or one-fourth of current $I_S$. Because of the area ratio of twice transistor Q4 to transistor Q3, this generally occurs when transistor Q3 conducts one-eighth of current $I_S$. Assuming no current flows in line 48A, the collector 68 of transistor Q1 also must conduct one-eighth of current $I_S$. If one-half current $I_S$ is the total current conducted by transistor Q1, then three-eighths of current $I_S$ must flow through collector 96 of transistor Q1. This sets the desired ratio of collector 96 to collector 68 of transistor Q1 to 3:1 to assure that the output transition occurs when the input voltage $V_{IN}$ is equal to reference voltage $V_C$.

The specific area ratios shown herein are provided as examples and are not required, as other ratios may be used to either eliminate the deadband or provide other specific deadband voltages. Additionally, the PNP transistors Q1 and Q2 could be replaced with NPN transistors, while the NPN transistors Q3 and Q4 could be replaced with PNP transistors without departing from the spirit of the present invention.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A voltage comparator network for comparing an input voltage with voltage windows, the comparator network comprising:

a first comparator circuit comparing an input voltage with a first threshold voltage, said first comparator circuit including a first differential input pair of transistors for receiving and comparing the input voltage with the first threshold voltage, the first differential input pair of transistors having one transistor with a first and a second collector, the second collector being coupled to an output line; and a second comparator circuit comparing the input voltage with a second threshold voltage, the second comparator circuit including a second differential input pair of transistors for comparing the input voltage with the second threshold voltage, said second comparator circuit having an input coupled to the output line of the first comparator circuit for receiving current when the input voltage is less than the first threshold voltage, said second comparator circuit further including an output for providing an output indicative or whether the input voltage is within a voltage window bounded by the first and second threshold voltages.

2. The voltage comparator network as defined in claim 1 wherein said first and second comparator circuits each receive sourced current supplied to the corresponding differential input pair of transistors.

3. The voltage comparator network as defined in claim 1 wherein said second comparator circuit further comprises a differential to single ended converter coupled to the second differential input pair of transistors.

4. The voltage comparator network as defined in claim 3 wherein said differential to single ended converter comprises a pair of base-coupled transistors.

5. The voltage comparator network as defined in claim 1 wherein said first comparator circuit further includes an output for providing an output indicative of whether the input voltage is within a voltage window which is less than the first threshold voltage.

6. A voltage comparator circuit for comparing an input voltage with one or more successive voltage windows, the comparator circuit comprising:

a first comparator cell for comparing an input voltage with a first threshold voltage, said first comparator cell including:
a first transistor and a second transistor connected as a differential input pair, the first and second transistors each having an emitter for receiving a biased current;
a threshold voltage input connected to a base of the first transistor for receiving the first threshold voltage;
a voltage input connected to a base of the second transistor for receiving the input voltage;
a differential to single ended converter connected between a collector of the first transistor and a collector of the second transistor; and
an output path coupled to a second collector of the second transistor for supplying a current when the input voltage is less than the first threshold voltage;

a second comparator cell for comparing the input voltage with a second voltage threshold, said second comparator cell comprising:
a first transistor and a second transistor connected as a differential input pair, the first and second transistors each having an emitter for receiving a biased current;
a threshold voltage input connected to a base of the first transistor for receiving the second threshold voltage;
a voltage input connected to a base of the second transistor for receiving the input voltage;
an input line coupled to the output path of the first comparator cell for receiving said current when the input voltage is less than the first threshold voltage;
a differential to single ended converter connected between a collector of the first transistor and a collector of the second transistor; and
an output coupled to the differential to single ended converter for providing an output voltage indicative of the comparison of the input voltage with a voltage window bounded by the first and second threshold voltages.

7. The voltage comparative circuit as defined in claim 6 wherein the second comparator cell further comprises an output path coupled to a second collector of the second transistor for supplying a current when the input voltage is less than the second voltage threshold.

8. The voltage comparator circuit as defined in claim 7 further comprising a third comparator cell for comparing the input voltage with a third voltage threshold, said third comparator cell comprising:

a first transistor and a second transistor connected as a differential input pair, the first and second transistors each having an emitter for receiving a biased current;
a threshold voltage input connected to a base of the first transistor for receiving the third threshold voltage;
a voltage input connected to a base of the second transistor for receiving the input voltage;
an input line coupled to the output path of the second comparator cell for receiving the current when the input voltage is less than the second threshold voltage;

a differential to single ended converter connected between a collector of the first transistor and a collector of the second transistor; and an output coupled to the differential to single ended converter for providing an output voltage indicative of the comparison of the input voltage with a voltage window bounded by the second and third threshold voltages.

9. The voltage comparator circuit as defined in claim 6 wherein said first comparator cell further includes an output coupled to the differential to single ended converter for producing an output signal indicative of whether the input voltage is within a voltage window which is less than the first threshold voltage.

10. A successive voltage window comparator circuit for comparing an input voltage with a series of successive voltage windows, said comparator circuit comprising:

a series of interconnected comparator circuit cells for receiving predetermined respective threshold voltages and defining a series of successive voltage windows and receiving a common input voltage, each comparator circuit cell further including an output for providing an output voltage indicative of a comparison of the input voltage with the successive voltage windows, each comparator circuit cell including:

a first transistor and a second transistor connected as a differential input pair, the first and second transistors each having an emitter for receiving a biased current;

a threshold voltage input connected to a base of the first transistor for receiving one of said respective threshold voltages;

a voltage input connected to a base of the second transistor for receiving the input voltage;

a differential to single ended converter connected between a collector of the first transistor and a collector of the second transistor;

an output coupled to the differential to single ended converter for providing an output signal indicative of the comparison of the input with the respective threshold voltage; and an output path coupled to a second collector of the second transistor for supplying a current to the next highest successive comparator circuit cell when the input voltage is less than the respective threshold voltage.

11. A method of comparing an input voltage with a series of successive voltage windows so as to detect the input voltage within one of said voltage windows, said method comprising the steps of:

comparing with a first comparator cell an input voltage and a firm threshold voltage, said first comparator cell having a first differential input pair of transistors with one of the transistors having a first and a second collector;

comparing with a second comparator cell the input voltage and a second threshold voltage which has an amplitude larger than the first threshold voltage;

sourcing a current from the second collector of the first differential input pair of transistors to the second comparator cell when the input voltage is less than the first threshold voltage;

outputting a signal indicative of the comparison of the input voltage with a voltage window bounded by the first and second threshold voltages;

comparing with a third comparator cell the input voltage and a third threshold voltage which has an amplitude larger than the second threshold voltage, said second comparator cell having a second differential input pair of transistors with one of the transistors having a first and a second collector;

sourcing a current from the second collector of the second differential input pair of transistors to the third comparator cell when the input voltage is less than the second threshold voltage; and outputting a signal indicative of the comparison of the input voltage with a voltage window bounded by the second and third threshold voltages.

\* \* \* \* \*